United States Patent [19]
Cheng et al.

[11] Patent Number: 5,974,510
[45] Date of Patent: Oct. 26, 1999

[54] METHOD FOR TESTING THE NON-CACHEABLE REGION FUNCTIONING OF A CACHE MEMORY CONTROLLER

[75] Inventors: Lei Cheng; Thomas F. Eckert; Michael T. Wisor, all of Austin, Tex.

[73] Assignee: Advanced Micro Devices, Inc., Sunnyvale, Calif.

[21] Appl. No.: 08/962,361

[22] Filed: Oct. 31, 1997

[51] Int. Cl.⁶ .................................................. G06F 12/08
[52] U.S. Cl. .......................... 711/138; 711/128; 711/135; 711/145; 714/42
[58] Field of Search .................................... 711/138, 128, 711/135, 143; 714/42

[56] References Cited

U.S. PATENT DOCUMENTS

| | | | |
|---|---|---|---|
| 4,575,792 | 3/1986 | Keeley | 714/42 |
| 4,686,621 | 8/1987 | Keeley et al. | 714/40 |
| 5,249,281 | 9/1993 | Fuccio et al. | 711/123 |
| 5,406,504 | 4/1995 | Denisco et al. | 702/117 |
| 5,511,180 | 4/1996 | Schieve | 711/172 |
| 5,537,572 | 7/1996 | Michelsen et al. | 711/135 |
| 5,613,087 | 3/1997 | Chin et al. | 711/154 |

*Primary Examiner*—Reginald G. Bragdon
*Attorney, Agent, or Firm*—Skjerven, Morrill, MacPherson, Franklin & Friel LLP

[57] ABSTRACT

A method for testing the functioning of a non-cacheable region within a cache having a cache controller programmed with a write-back write policy and a non-cacheable region included in an image memory region corresponding to a physical memory region. A first data pattern is written to the cache tagged at a first addressable location of a cacheable region in the physical memory region. A second data pattern is written to the cache tagged at a second addressable location in the image memory region contained within both the non-cacheable region and the cacheable region and corresponding to the first addressable location. The data stored in the cache and tagged at the first addressable location and corresponding to the non-cacheable region only of the second addressable location is read to determine whether the first data pattern remains in the cache thereby indicating that the non-cacheable region is functioning correctly. The data stored and tagged at a third addressable location in the physical memory region and corresponding to the cacheable region only of the second addressable location in the image memory region is read to determine whether the second data pattern remains in the cache tagged at the third addressable location thereby indicating that the non-cacheable region is functioning correctly and that the memory size of the non-cacheable region is correct.

37 Claims, 6 Drawing Sheets

METHOD FOR TESTING THE NON-CACHEABLE REGION FUNCTIONING OF A CACHE MEMORY CONTROLLER

BACKGROUND OF THE INVENTION

1. Field of the Invention

The present invention is directed in general to computer systems including cache memories including non-cacheable regions and, more specifically, to testing the functioning of the non-cacheable regions.

2. Description of the Related Art

In a computer system, the operating speed of the system processor is dependent upon the rate at which data can be exchanged between main memory and the processor. In an attempt to reduce the time required for the exchange of data between the processor and main memory, many computers include a cache memory placed between the processor and main memory. The cache memory, or cache, is a small, high-speed buffer memory that is used to temporarily store portions of the contents of main memory. In selecting which portions of the contents of main memory to store, a cache controller estimates which data will soon be requested by the processor. The increased access speed of the cache memory generally results in a reduction in the average time necessary for the processor to access data from main memory.

A cache memory consists of many blocks of one or more words of data. Each block has associated with it an address tag. Each address tag uniquely identifies a memory block stored in the cache directory. If the desired data is in the cache, the cache provides the data to the processor. If the desired memory block is not in the cache, the block of data containing the requested data is retrieved from the main memory, stored in the cache, and supplied to the processor.

In addition to using a cache to retrieve data from main memory, the processor may also write data into the cache. Data is written to the cache instead of writing the data directly to main memory, or, in a write-through cache, data is written to the cache concurrently with the writing of the data to the main memory. When the processor desires to write data to memory, the cache controller checks the cache directory to determine if the data block into which the data is to be written resides in the cache. If the data block exists in the cache, the processor writes the data into the data block in the cache. If the data block into which the data is to be written is not in the cache, the data block must be fetched into the cache or the data written directly into the main memory. However, the cache is transparent to the computer system, so determining the actual contents and functioning of the cache at any particular point in time is difficult. Specifically, any attempt to access the data in the cache is likely to result in a reallocation of the cache contents.

Certain spaces in main memory should not be cached, and the cache memory may be programmed to accommodate non-cacheable addresses for non-cacheable regions of the main memory. For example, portions of the main memory address range which are used as device inputs should not be cached especially in processors which don't differentiate between memory and I/O addresses. Should the processor be looping while awaiting a change in the status of a switch panel, for example, no change will be noticed if the first reading from the switch panel was cached. Some processors also use a portion of the main memory address range for communication with coprocessors. The data cannot be assumed to be static, so a cached copy might become out of date. Multiprocessor systems also often communicate via flags which are set and cleared in dedicated main memory locations. No communication can occur if the main memory flag that one processor sets cannot be read by another since the other is reading a cached copy. All of these example are reasons for accommodating non-cacheable addresses within the cache or non-cacheable regions within memory.

SUMMARY OF THE INVENTION

In the present invention a technique is disclosed for testing the functioning of a non-cacheable region within a direct mapped cache memory. The cache memory has a cache controller programmed with a non-cacheable region and a write-back write policy and is included in a computer system having a main memory and a processing unit. The main memory and the processing unit are coupled to the cache memory, and the main memory is programmed to included an image memory region corresponding to a physical memory region.

The cache controller is programmed such that the non-cacheable region is tagged for the image memory region of the main memory. A first data pattern is written to the cache memory tagged at a first addressable location of a cacheable region in the physical memory region of the main memory. A second data pattern is written to the cache memory tagged at a second addressable location in the image memory region of the main memory. The second addressable location in the image memory region corresponds to the first addressable location in the physical memory region; however, the second addressable location is contained within both the non-cacheable region and the cacheable region.

In one embodiment of the present invention, the data stored in the cache memory and tagged at the first addressable location and corresponding to the non-cacheable region only of the second addressable location is read. The data is read to determine whether the first data pattern remains in the cache memory tagged at the first addressable location thereby indicating that the non-cacheable region is functioning correctly. A second embodiment of the present invention includes a third addressable location in the physical memory region of the main memory and corresponding to the cacheable region portion of the second addressable location in the image memory region. The data stored and tagged at the third addressable location is read to determine whether the second data pattern remains in the cache memory tagged at the third addressable location thereby indicating that the non-cacheable region is functioning correctly and that the memory size of the non-cacheable region is correct. The testing steps performed in the first and second embodiments are combined to provide a third embodiment of the present invention.

Previous techniques for testing the functioning of the non-cacheable regions of the cache memory have included the use of expensive special testing platform hardware or the use of time-consuming logic analyzer hardware and methods. The method of the present invention provides a simple testing technique that needs no additional or special hardware and is both time and cost effective.

BRIEF DESCRIPTION OF THE DRAWINGS

The present invention may be better understood and its numerous objects, features, and advantages made apparent to those skilled in the art by referencing the accompanying drawings.

DESCRIPTION OF THE PREFERRED EMBODIMENT(S)

Figure 1:
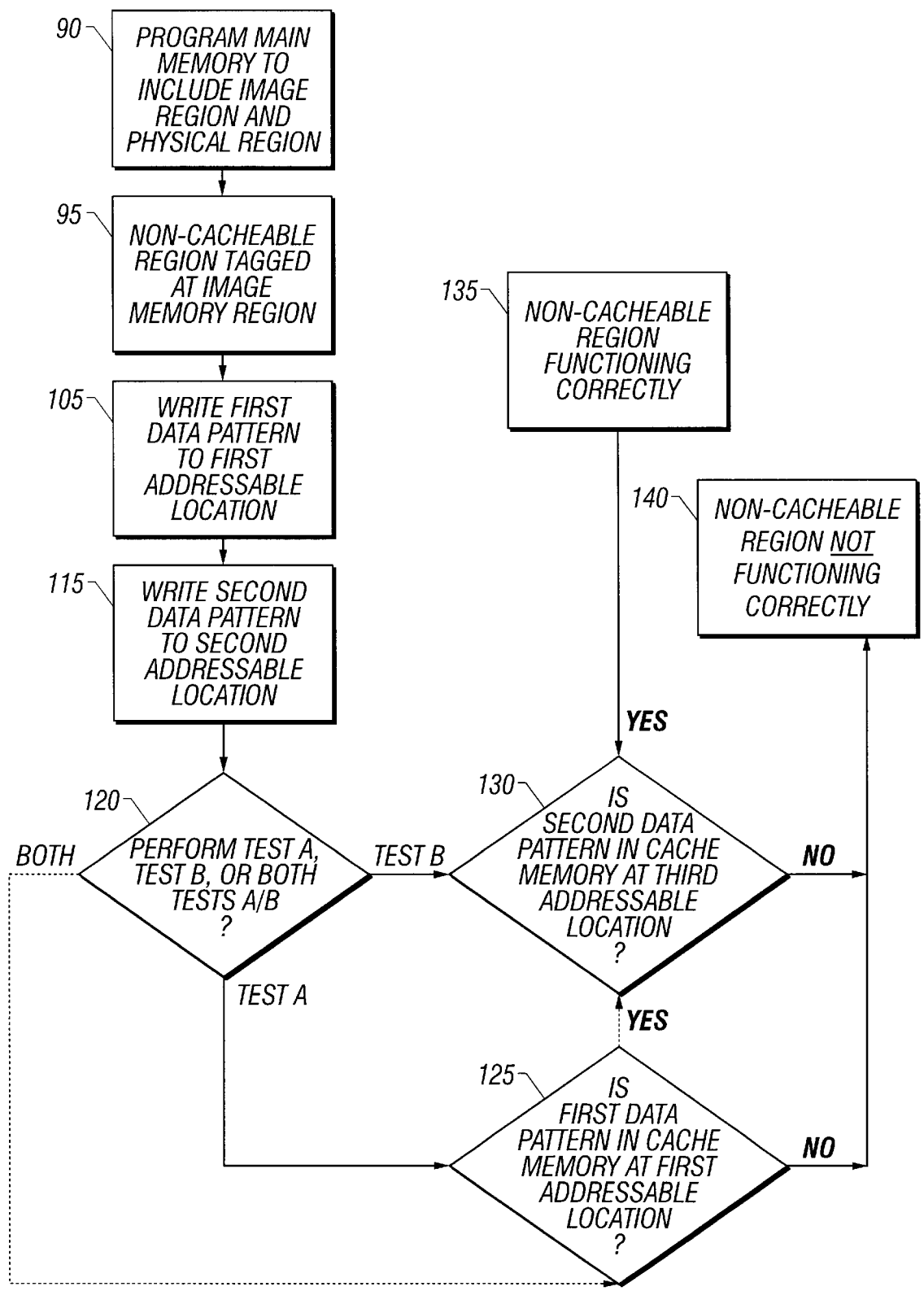
FIG. 1 is a flowchart illustrating the method of the present invention.

The flowchart of FIG. 1 illustrates the method of the present invention for testing the functioning of a non-cacheable region within a direct mapped cache memory. The cache memory includes a cache controller programmed with a non-cacheable region and a write-back write policy and is, for example, in a computer system having a main memory and a processing unit coupled to the cache memory. The method of the present invention includes programming the main memory, per block 90, to include an image memory region and a physical memory region wherein the image memory region corresponds to the physical memory region. At block 95 the cache controller is programmed so that the non-cacheable region is tagged at the image memory region of the main memory.

A first data pattern is written to the cache memory tagged at a first addressable location of the cacheable region in the physical memory region per block 105. A second data pattern is also written to the cache memory tagged at a second addressable location in the image memory region per block 115. The second addressable location in the image memory region corresponds to the first addressable location in the physical memory region; however, the second addressable location is contained within both the non-cacheable region and the cacheable region. Different options of the method of the present invention for testing the functioning of the non-cacheable region are presented at decision block 120 wherein "Test A" is included in a first embodiment of the present invention, "Test B" is included in a second embodiment of the present invention, and a third embodiment of the present invention, titled "BOTH", combines both Test A and Test B.

In the first embodiment of the present invention, Test A is selected at decision block 120 and a determination is made at block 125 as to whether the first data pattern remains in the cache memory. At block 125, the data stored and tagged at the first addressable location and corresponding to the non-cacheable region of the second addressable location is read to determine whether the first data pattern remains in the cache memory tagged at the first addressable location. If the first data pattern remains in the cache memory tagged at the first addressable location, the non-cacheable region is functioning correctly as indicated at block 135.

In the second embodiment of the present invention, Test B is selected at decision block 120 and a determination is made at block 130 as to whether the second data pattern is in the cache memory tagged at a third addressable location. The third addressable location is in the cacheable region of the physical memory region and corresponds to the cacheable region of the second addressable location. At block 130, the data stored and tagged at the third addressable location is read to determine whether the second data pattern is in the cache memory tagged at the third addressable location. If the second data pattern is in the cache memory tagged at the third addressable location, the non-cacheable region is functioning correctly as indicated at block 140, and the memory size of the non-cacheable region is also functioning correctly.

In the third embodiment of the present invention, BOTH is selected at decision block 120 and both Test A and Test B are performed as previously described to determine whether the non-cacheable region is functioning correctly and the memory size of the non-cacheable region is correct.

Figure 2:
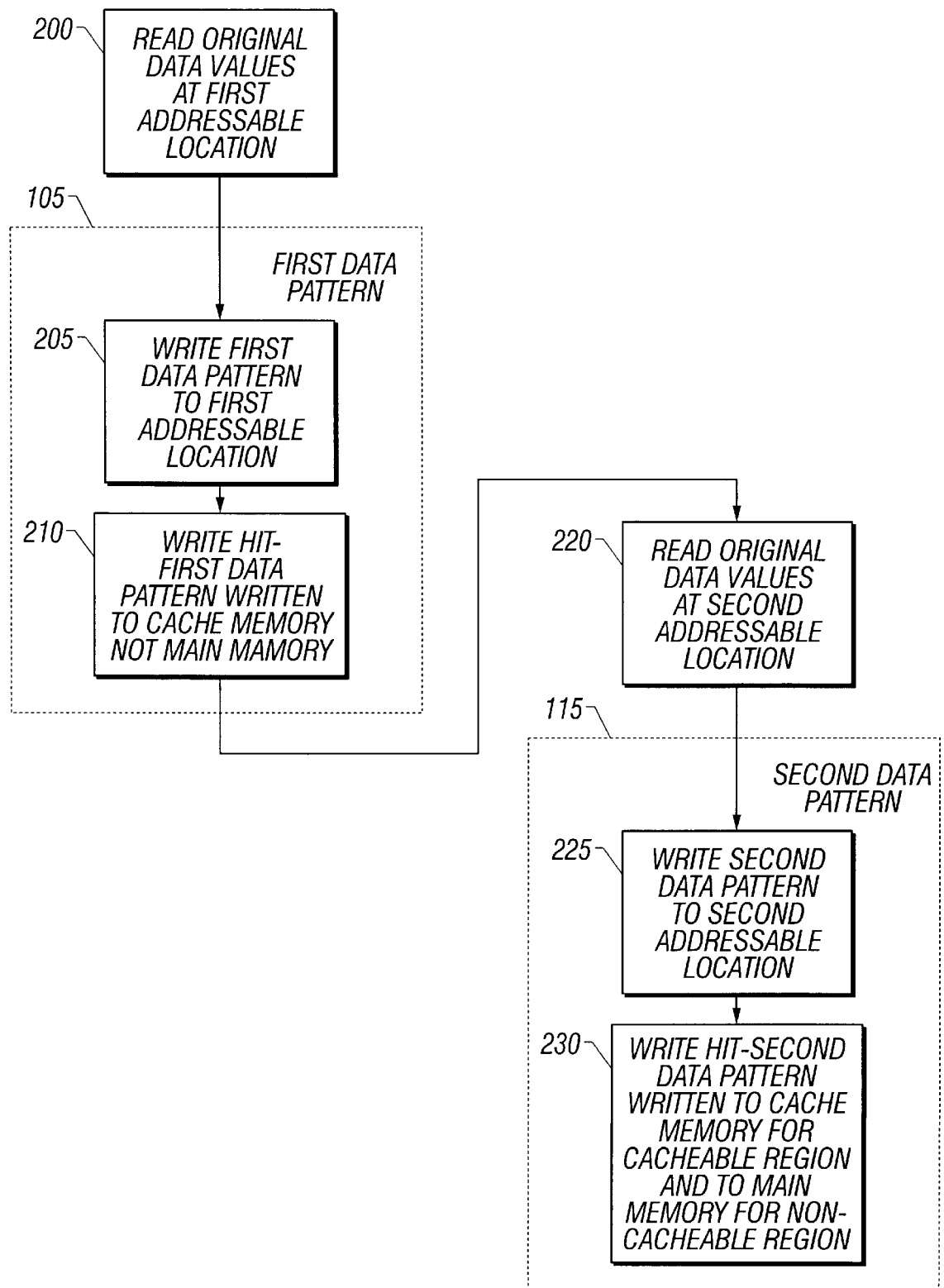
FIG. 2 is a flowchart illustrating further details of the method of the present invention.

In FIG. 2, the steps of writing the first data pattern and the second data pattern to the first addressable location and the second addressable location, respectively, are described in greater detail. The movement of the data patterns within the cache memory and the main memory is described in FIG. 4 below.

In FIG. 2, the method of the present invention is illustrated as further including, per block 200, the step of reading first original data values from the first addressable location prior to writing the first data pattern to the cache memory per section 105. The First Data Pattern section 105 includes writing the first data pattern to the cache memory tagged at the first addressable location of the cacheable region in the physical memory region at block 205 wherein a write hit at the first addressable location causes the first data pattern to be written to the cache memory and not to the main memory per block 210.

The method of the present invention is illustrated as further including, per block 220, the step of reading second original data values from the second addressable location prior to the step of writing the second data pattern to the cache memory per section 115. The second original data values are read directly from the main memory to the processing unit for the non-cacheable region of the second addressable location. However, the cacheable region of the second addressable location is a read miss and, therefore, the first data pattern is read from the main memory through the cache memory for the cacheable region of the second addressable location.

The Second Data Pattern section 115 includes writing the second data pattern to the cache memory tagged at the second addressable location in the image memory region per block 225. A write hit in the cacheable region of the second addressable location causes the second data pattern to be written to the cache memory and not to the main memory for the cacheable region of the second addressable location. The second data pattern is written directly to the corresponding physical memory region of the main memory for the non-cacheable region of the second addressable location per block 230. After block 230, the method of the present invention continues as described in FIG. 1 (at decision block 120 of FIG. 1) for testing the functioning of the non-cacheable region.

Figure 3:
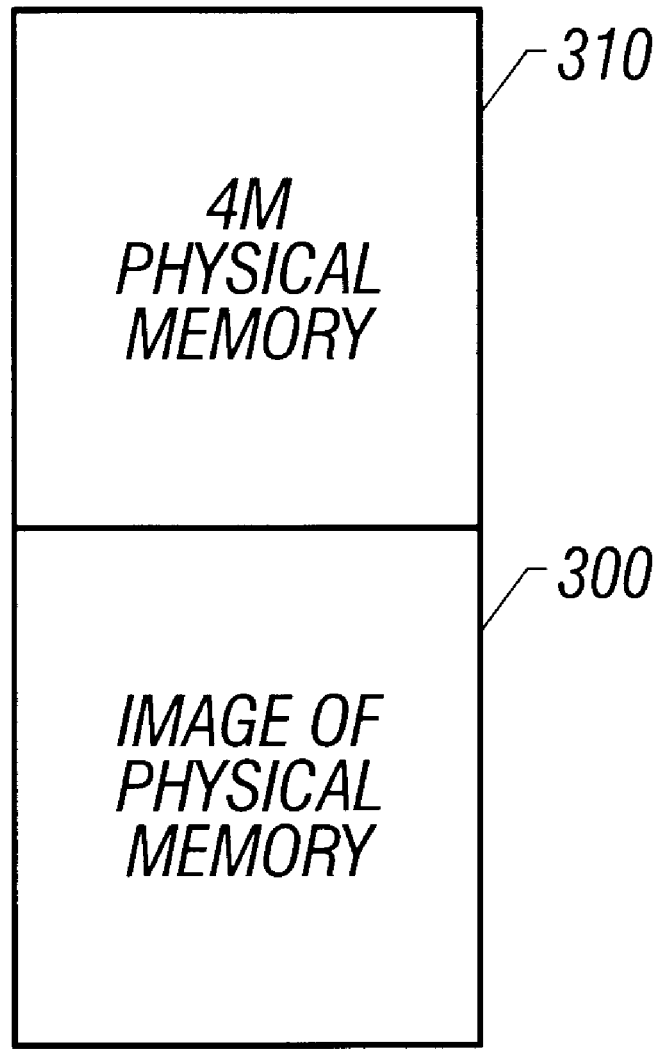
FIG. 3 is a schematic illustrating the main memory configuration programmed to include an image memory region reflecting a physical memory region.

FIG. 3 illustrates the main memory configuration. In the method of the present invention, the main memory is, for example, a dynamic random access memory ("DRAM"), such as a one 4 Mbytes DRAM single in-line memory module ("SIMM") having a DRAM controller programmed to include an image memory region 300 and a physical memory region 310.

For example, the DRAM controller is programmed to indicate 8 Mbytes DRAM SIMM wherein the processor operates as if the computer system has 8 Mbytes DRAM. The 4 Mbytes DRAM SIMM only has an address space up to 3FFFFFH, as illustrated in FIG. 3. Any address change beyond the 4 Mbytes has no effect on the DRAM. The second 4 Mbytes memory space (address 400000H to address 7FFFFFH) becomes the image of the first 4 Mbytes memory space (address 000000H to address 3FFFFFH), the physical or real memory, indicated as image memory region 300 and physical memory region 310, respectively. Therefore, if the processor attempts to write data to an addressable location in the image memory region 300, for example a 1 Mbyte addressable location, the data is actually written to the corresponding addressable location in the physical memory region 310, for example a corresponding 5 Mbyte addressable location. The DRAM controller is configured such that the most significant address line must be a row address line for the DRAM. This prevents the image memory region 300 and the physical memory region 310 from interleaving instead of remaining split in two, wherein the lower half of the memory is, for example, the real physical memory and the upper half of the programmed memory addressing the same physical memory as the lower half (a mirror memory image).

FIGS. 4A through 4F illustrate the flow of data when the non-cacheable region is functioning correctly within a main memory 400 and a cache memory 410 for the steps described in the present invention. The cache memory 410 write policy is a write-back write policy and the cache controller is programmed such that a non-cacheable region 420 is tagged at an image memory region 430 of the main memory 400, for example at the 500000H to 51FFFFFH addressable location (a 64K non-cacheable region).

Figure 4A:
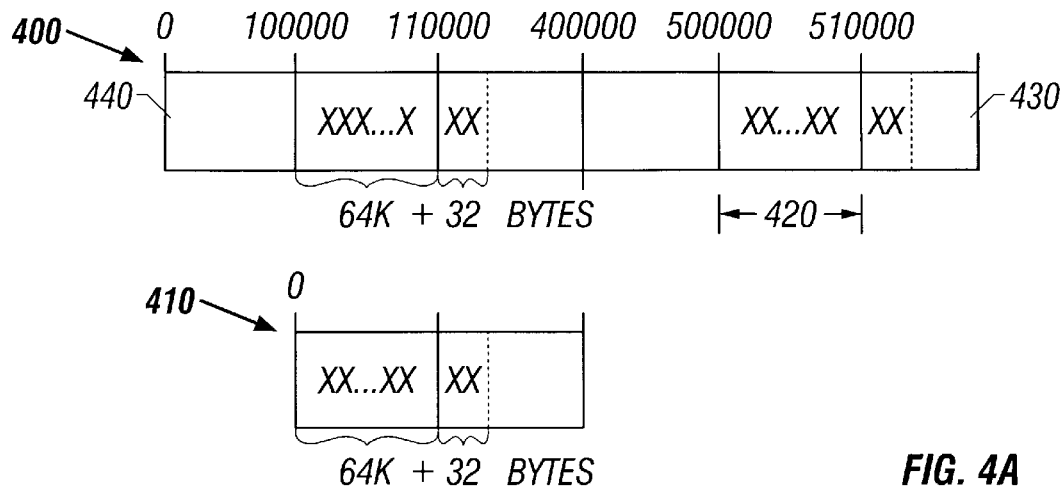
FIGS. 4A–4F illustrate the flow of data within the main memory and the cache memory at each step in the method of the present invention when a non-cacheable region is functioning correctly.

FIG. 4A illustrates the step of reading the first original data values from the first addressable location wherein the first addressable location is in the cacheable region of a physical memory region 440 of the main memory 400. For example, the first original data values (indicated as "XXX . . . X") are read from the first addressable location shown herein, for example, as 64K+32 bytes beginning at the 100000H addressable location in the physical memory region 440 of the main memory 400 and corresponding to 64K+32 bytes beginning at the 500000H addressable location in the image memory region 430 of the main memory 400. The first original data values are then read back into the cache memory 410 tagged at the 64K+32 bytes first addressable location.

Figure 4B:
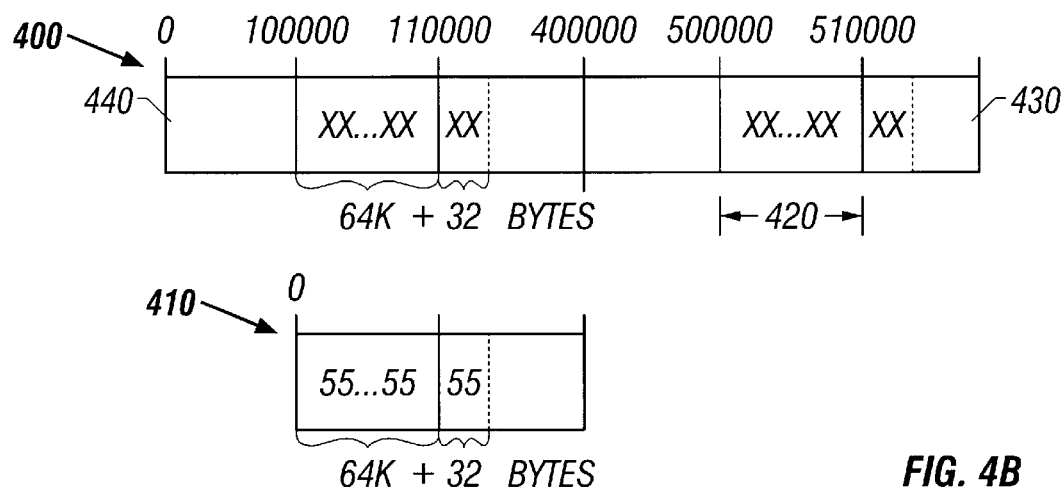

In FIG. 4B, the first data pattern (illustrated herein as a 55H data pattern) is written to the cache memory 410 tagged at the first addressable location, 64K+32 bytes beginning at the 100000H addressable location in the physical memory region 440. The step of writing the first data pattern includes a write-hit at the first addressable location, for example, as illustrated in FIG. 4B, the first data pattern (55H) is written to the cache memory 410 only and not to the main memory 400.

Figure 4C:
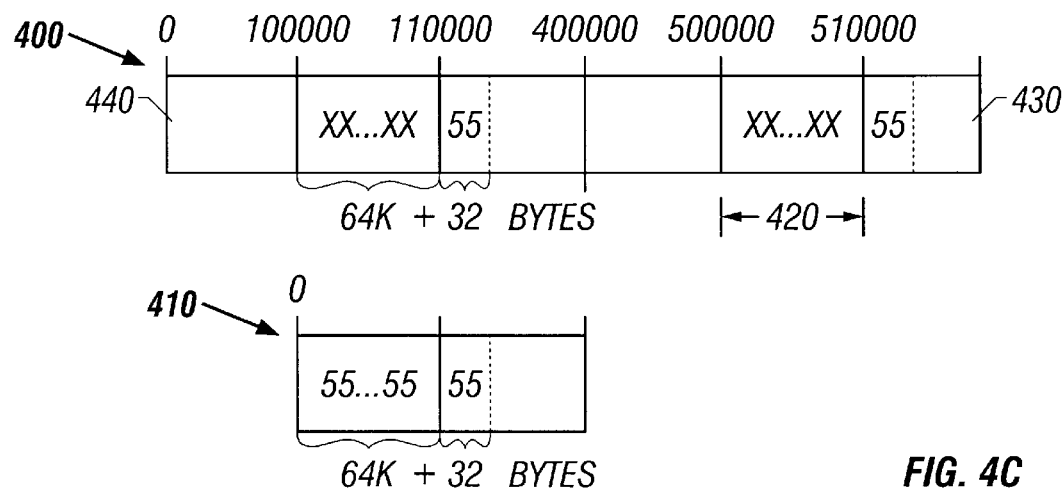

FIG. 4C illustrates the step of reading the second original data values (indicated as "XXX . . . X") from the second addressable location. The second addressable location, is in the image memory region 430 of the main memory 400 and corresponds to the first addressable location in the physical memory region 440; however, the second addressable is contained within both the non-cacheable region 420 and the cacheable region. For example, the second addressable location is shown herein as 64K+32 bytes beginning at the 500000H addressable location in the image memory region 430 of the main memory 400 and corresponding to 64K+32 bytes beginning at the 100000H addressable location in the physical memory region 440 of the main memory 400. The non-cacheable region 420 is a 64K region beginning at 500000H addressable location. Therefore, for the first 64K bytes, the second original data values ("XXX . . . X") are read directly from main memory 400 to the processing unit and not through the cache memory 410 because the first 64K bytes are in the non-cacheable region 420. The next 32 bytes are a read-miss, and the first data pattern (55H) is read from main memory 400 through the cache memory 410 because the next 32 bytes are in the cacheable region.

Figure 4D:
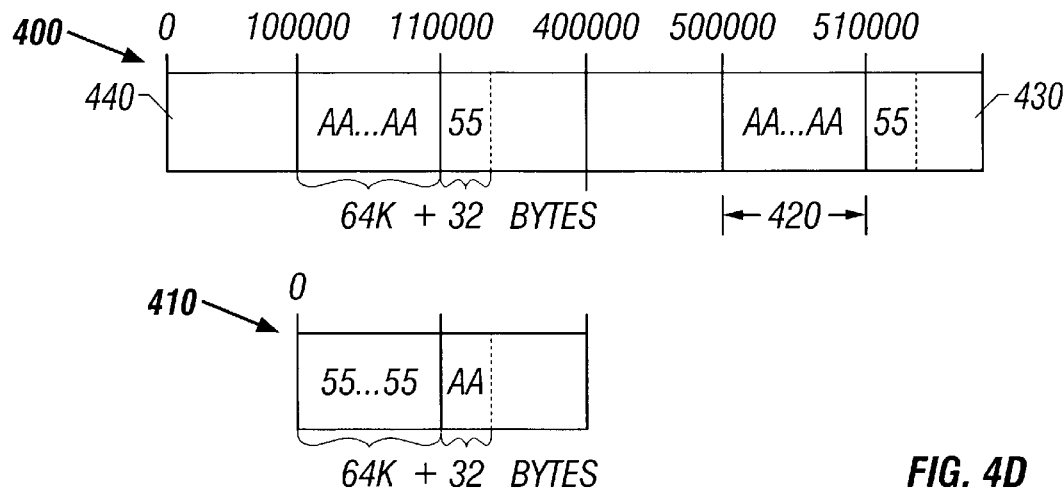

In FIG. 4D, the second data pattern (illustrated herein as an AAH data pattern) is written to the cache memory 410 tagged at the second addressable location, 64K+32 bytes beginning at the 500000H addressable location in the image memory region 430. The step of writing the second data pattern (AAH) includes a write hit in the cacheable region (the last 32 bytes) of the second addressable location, wherein, for example, the second data pattern (AAH) is written to the cache memory 410 tagged at the last 32 bytes of the second addressable location and not to the main memory 400. However, for the non-cacheable region 420 of the second addressable location, the first 64K bytes, the second data pattern (AAH) is written directly to the first 64K bytes of the first addressable location in the physical memory region 440 (corresponding to the non-cacheable region 420 in the image memory region 430 of the main memory 400) and not to the cache memory 410.

Figure 4E:
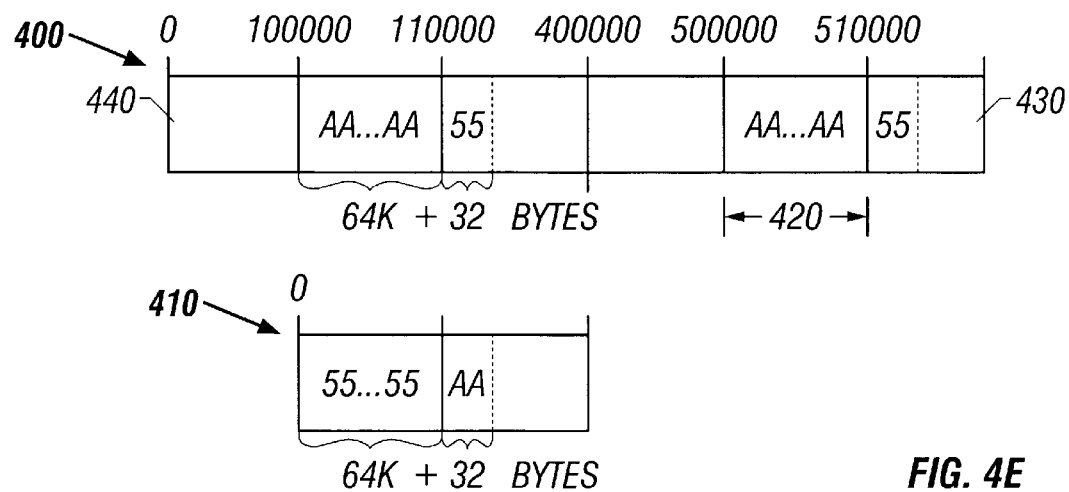

In FIG. 4E, data stored in the cache memory 410 and tagged at the first addressable location and corresponding to the non-cacheable region 420 of the second addressable location is read, which in the example of FIG. 4E is the 64K bytes beginning at the 100000H addressable location. If the first data pattern (55H) remains in the cache memory for the 64K bytes beginning at the 100000H addressable location (tagged at the first addressable location) as shown in FIG. 4E, the non-cacheable region 420 is functioning correctly.

Figure 4F:
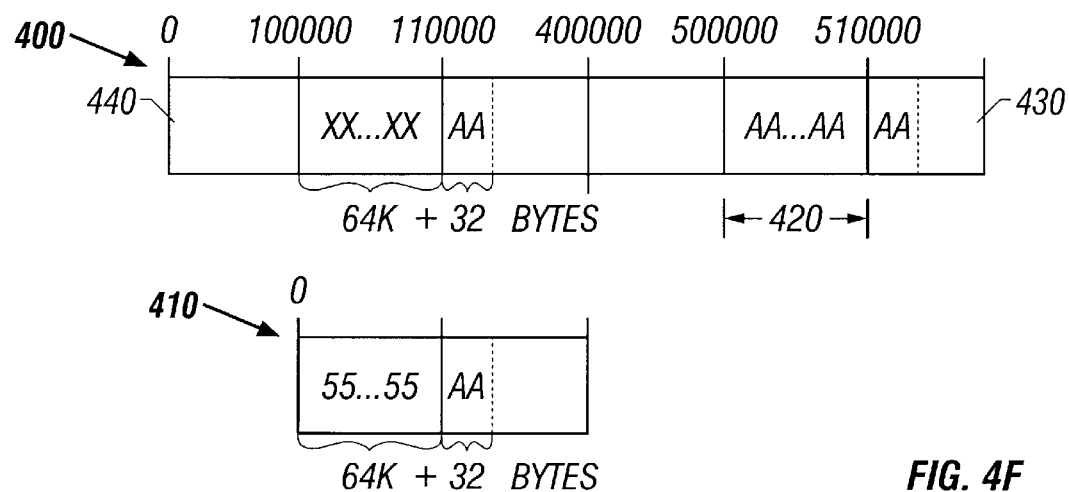

In FIG. 4F, data stored in the cache memory 410 and tagged at a third addressable location of a cacheable region in the physical memory region 440, corresponding to the cacheable region of the second addressable location is read. The cacheable region of the second addressable location is the last 32 bytes beginning at 510000H addressable location in the image memory region 430 which also corresponds to the last 32 bytes of the first addressable location in the physical memory region 440 or, as shown, 32 bytes beginning at the 110000H addressable location. Therefore, the third addressable location is the 32 bytes beginning at the 110000H addressable location in the physical memory region 440.

The step of reading the data stored and tagged at the third addressable location, 32 bytes beginning at 110000H addressable location, includes a read miss. Therefore, when the non-cacheable region 420 is functioning correctly and the memory size of the non-cacheable region 420 is correct, the second data pattern (AAH) stored in the cache memory 410 tagged at 110000H for 32 bytes (the third addressable location) is flushed into the cacheable region of the second addressable location and the second data pattern (AAH) is then read back through the cache memory 410 tagged at the 32 bytes 110000H addressable location.

Figure 5:
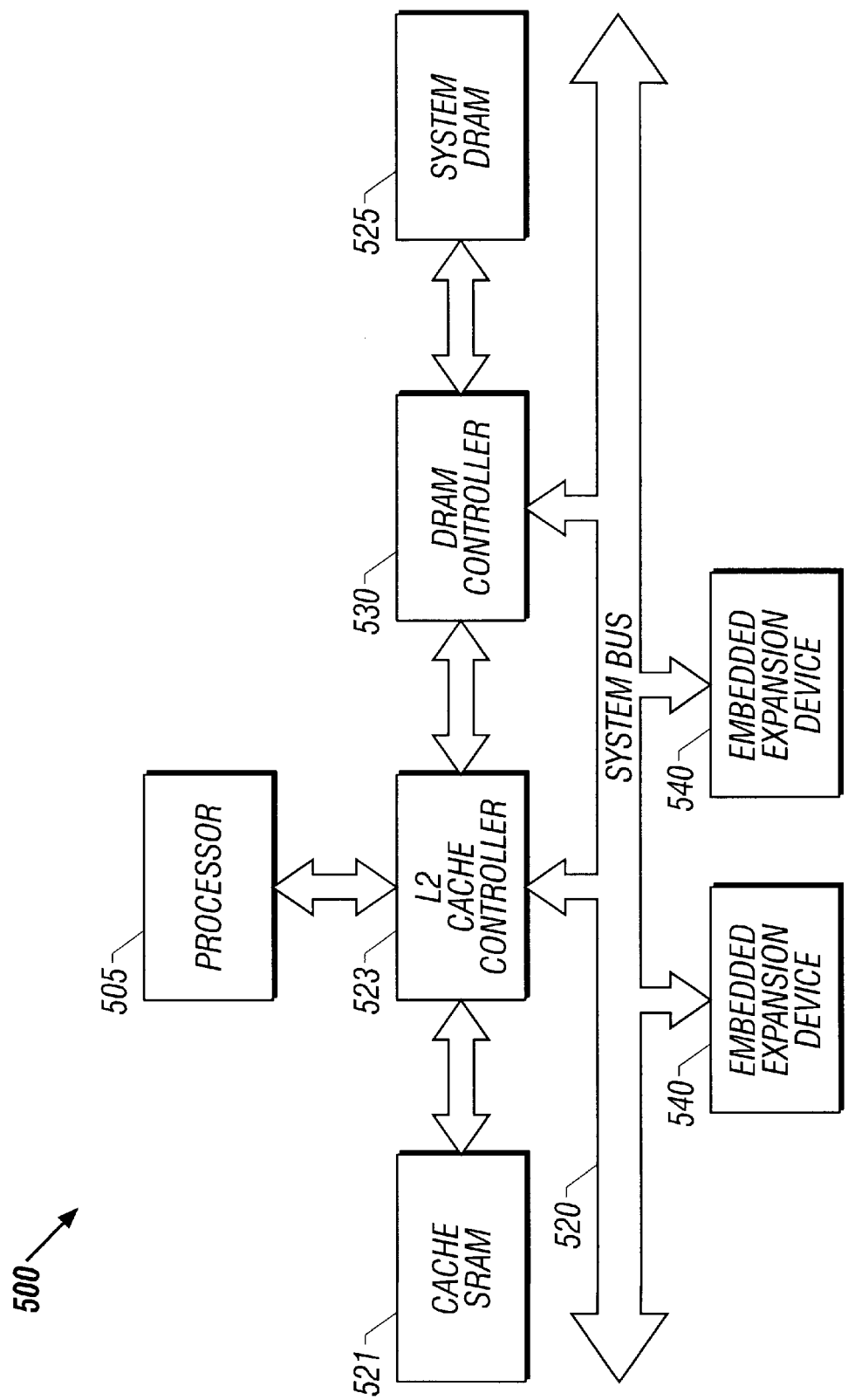
FIG. 5 shows a block diagram of the disclosed computer system having a processor, a main memory, and a cache memory in accordance with the present invention. The use of the same reference symbols in different drawings indicates similar or identical items.

FIG. 5 shows a block diagram of the disclosed computer system 500. The computer system 500 includes a processor 505, such as for example a Pentium™ Processor or a VIA core logic chip set, coupled to system bus 520 through, for example, a level two (L2) cache memory 521 and cache controller 523. The processor 505 chip set includes an L1 cache memory (not shown) and may also include the L2 cache controller 523 within the processor 505 chip set. A system memory 525, for example a DRAM SIMM module, is coupled to system bus 520 through a DRAM memory controller 530, also coupled to the processor 505. System memory 525 stores application programs and data for execution by processor 505. As previously described, the system memory 525 is programmed to include an image memory region corresponding to a physical memory region. System bus 520 includes conventional data, address and control lines confining to, for example, the peripheral connect interface (PCI) architecture.

By assuming that the slower system memory 525 is only accessed by the processor 505 once to fetch a particular instruction or data, and all subsequent executions operate from the faster L1 and/or L2 cache memory 521, effective memory speed is greatly increased. Cache memories typically include a cache controller and a cache directory. The L2 cache memory 521 is, for example, a direct mapped static random access memory (SRAM) and is programmed with a non-cacheable region. The method of the present invention tests the functioning of the non-cacheable region of the L2 cache memory 521. The L1 cache memory (located within processor 505 chip set) is turned off during the testing of the non-cacheable region of the L2 cache memory 521. A direct mapped cache is a cache where there is only one possible location for each data entry. The method of the present invention is transparent to the processor 505, so that the processor 505 doesn't "know" which data is cached and which data is not cached.

The L2 cache controller 523 is programmed with a write-back write policy. A copy-back or write-back write policy causes the processor 505 to write data into the L2 cache memory 521 and not onto the system memory 525 until that data line in the L2 cache memory 521 is to be replaced. A write hit or a read hit occurs when the data the processor 505 wants is located in the L2 cache memory 521, and a write miss or a read miss occurs when the data is not in the L2 cache memory 521 and must be fetched from system memory 525.

The system bus 520 is coupled to expansion devices 540 which are further coupled to various I/O controllers and I/O devices (not shown) such as a hard drive, a keyboard, or a display device. The expansion devices 540 may also be coupled to a nonvolatile memory BIOS ROM in which is stored Basic Input/Output System (BIOS) software. BIOS is a microcode software interface between an operating system or application programs and the hardware of computer system 500. In operation, BIOS is executed from system memory 525. The method for testing the functioning of the non-cacheable region of the L2 cache memory 521 of the present invention may also be stored in non-volatile memory such as BIOS.

The foregoing has described a methodology which provides an efficient and effective capability for testing the functioning of a non-cacheable region in a cache memory included, for example, in a computer system. The method of the present invention provides a simple testing technique that needs no additional or special hardware and is both time and cost effective.

Other embodiments are within the following claims and while only certain preferred features of the invention have been shown by way of illustration, many modifications and changes will occur. For example, while the preferred embodiment is set forth as software, it is anticipated that the invention could be implemented in hardware such as an application-specific integrated circuit or a program product stored on a computer readable medium. It is therefore to be understood that the present claims are intended to cover all such modifications and changes which fall within the true spirit of the invention.

What is claimed is:

1. A method for testing the functioning of a non-cacheable region within a direct mapped cache memory having a cache controller programmed with a non-cacheable region and a write-back write policy in a computer system having a main memory and a processing unit, the main memory and the processing unit coupled to the cache memory, the method comprising the steps of:

programming the main memory to include an image memory region corresponding to a physical memory region;

programming the cache controller wherein the non-cacheable region is tagged at the image memory region of the main memory;

writing a first data pattern to the cache memory tagged at a first addressable location of a cacheable region in the physical memory region;

writing a second data pattern to the cache memory tagged at a second addressable location in the image memory region, the second addressable location corresponding to the first addressable location in the physical memory region and wherein the second addressable location is contained within both the non-cacheable region and a cacheable region; and reading data stored and tagged at the first addressable location and corresponding to the non-cacheable region of the second addressable location to determine whether the first data pattern remains in the cache memory tagged at the first addressable location thereby indicating that the non-cacheable region is functioning correctly.

2. A method for testing, as recited in claim 1, further comprising the step of:

reading first original data values from the first addressable location prior to the step of writing the first data pattern.

3. A method for testing, as recited in claim 2, wherein the step of writing the first data pattern includes a write hit at the first addressable location, wherein the first data pattern is written to the cache memory and not to the main memory.

4. A method for testing, as recited in claim 1, further comprising the step of:

reading second original data values from the second addressable location prior to the step of writing the second data pattern wherein the second original data values are read directly from the main memory to the processing unit for the non-cacheable region of the second addressable location and wherein the cacheable region of the second addressable location is a read miss and the first data pattern is read from the main memory through the cache memory for the cacheable region of the second addressable location.

5. A method for testing, as recited in claim 4, wherein the step of writing the second data pattern includes a write hit in the cacheable region of the second addressable location, wherein the second data pattern is written to the cache memory and not to the main memory for the cacheable region of the second addressable location and is written directly to the corresponding physical memory region of the main memory for the non-cacheable region of the second addressable location.

6. A method for testing, as recited in claim 1, further comprising the step of:

reading data stored and tagged at a third addressable location of a cacheable region in the physical memory region, wherein the third addressable location corresponds to the cacheable region of the second addressable location, to determine whether the second data pattern is in the cache memory tagged at the third addressable location thereby indicating that the non-cacheable region is functioning correctly and that the memory size of the non-cacheable region is correct.

7. A method for testing, as recited in claim 6, wherein the step of reading the data stored and tagged at the third addressable location includes a read miss wherein, when the non-cacheable region is functioning correctly and the memory size of the non-cacheable region is correct, the second data pattern stored in the cache memory is flushed into the cacheable region of the second addressable location and is then read back through the cache memory tagged at the third addressable location.

8. A method for testing the functioning of a non-cacheable region within a direct mapped cache memory having a cache controller programmed with a non-cacheable region and a write-back write policy in a computer system having a main memory and a processing unit, the main memory and the processing unit coupled to the cache memory, the method comprising the steps of:

programming the main memory to include an image memory region corresponding to a physical memory region;

programming the cache controller wherein the non-cacheable region is tagged at the image memory region of the main memory;

writing a first data pattern to the cache memory tagged at a first addressable location of a cacheable region in the physical memory region;

writing a second data pattern to the cache memory tagged at a second addressable location in the image memory region, the second addressable location corresponding to the first addressable location in the physical memory region and wherein the second addressable location is contained within both the non-cacheable region and a cacheable region; and reading data stored and tagged at a third addressable location of a cacheable region in the physical memory region, wherein the third addressable location corresponds to the cacheable region of the second addressable location, to determine whether the second data pattern is in the cache memory tagged at the third addressable location thereby indicating that the non-cacheable region is functioning correctly and that the memory size of the non-cacheable region is correct.

9. A method for testing, as recited in claim 8, wherein the step of reading the data stored and tagged at the third addressable location includes a read miss wherein, when the non-cacheable region is functioning correctly and the memory size of the non-cacheable region is correct, the second data pattern stored in the cache memory is flushed into the cacheable region of the second addressable location and is then read back through the cache memory tagged at the third addressable location.

10. A method for testing, as recited in claim 8, further comprising the step of:

reading first original data values from the first addressable location prior to the step of writing the first data pattern.

11. A method for testing, as recited in claim 10, wherein the step of writing the first data pattern includes a write hit at the first addressable location, wherein the first data pattern is written to the cache memory and not to the main memory.

12. A method for testing, as recited in claim 8, further comprising the step of:

reading second original data values from the second addressable location prior to the step of writing the second data pattern wherein the second original data values are read directly from the main memory to the processing unit for the non-cacheable region of the second addressable location and wherein the cacheable region of the second addressable location is a read miss and the first data pattern is read from the main memory through the cache memory for the cacheable region of the second addressable location.

13. A method for testing, as recited in claim 12, wherein the step of writing the second data pattern includes a write hit in the cacheable region of the second addressable location, wherein the second data pattern is written to the cache memory and not to the main memory for the cacheable region of the second addressable location and is written directly to the corresponding physical memory region of the main memory for the non-cacheable region of the second addressable location.

14. A method for testing, as recited in claim 8, further comprising the step of:

reading data stored and tagged at the first addressable location and corresponding to the non-cacheable region of the second addressable location to determine whether the first data pattern remains in the cache memory tagged at the first addressable location thereby indicating that the non-cacheable region is functioning correctly.

15. A method for testing the functioning of a non-cacheable region within a direct mapped cache memory having a cache controller programmed with a non-cacheable region and a write-back write policy in a computer system having a main memory and a processing unit, the main memory and the processing unit coupled to the cache memory, the method comprising the steps of:

programming the main memory to include an image memory region corresponding to a physical memory region;

programming the cache controller wherein the non-cacheable region is tagged at the image memory region of the main memory;

writing a first data pattern to the cache memory tagged at a first addressable location of a cacheable region in the physical memory region;

writing a second data pattern to the cache memory tagged at a second addressable location in the image memory region, the second addressable location corresponding to the first addressable location in the physical memory region and wherein the second addressable location is contained within both the non-cacheable region and a cacheable region;

reading data stored and tagged at the first addressable location and corresponding to the non-cacheable region of the second addressable location to determine whether the first data pattern remains in the cache memory tagged at the first addressable location thereby indicating that the non-cacheable region is functioning correctly; and reading data stored and tagged at a third addressable location of a cacheable region in the physical memory region, wherein the third addressable location corresponds to the cacheable region of the second addressable location to determine whether the second data pattern is in the cache memory tagged at the third addressable location thereby indicating that the non-cacheable region is functioning correctly and that the memory size of the non-cacheable region is correct.

16. A method for testing, as recited in claim 15, further comprising the step of:

reading first original data values from the first addressable location prior to the step of writing the first data pattern.

17. A method for testing, as recited in claim 16, wherein the step of writing the first data pattern includes a write hit at the first addressable location, wherein the first data pattern is written to the cache memory and not to the main memory.

18. A method for testing, as recited in claim 15, further comprising the step of:

reading second original data values from the second addressable location prior to the step of writing the second data pattern wherein the second original data values are read directly from the main memory to the processing unit for the non-cacheable region of the second addressable location and wherein the cacheable region of the second addressable location is a read miss and the first data pattern is read from the main memory through the cache memory for the cacheable region of the second addressable location.

19. A method for testing, as recited in claim 18, wherein the step of writing the second data pattern includes a write hit in the cacheable region of the second addressable location, wherein the second data pattern is written to the cache memory and not to the main memory for the cacheable region of the second addressable location and is written directly to the corresponding physical memory region of the main memory for the non-cacheable region of the second addressable location.

20. A method for testing, as recited in claim 15, wherein the step of reading the data stored and tagged at the third addressable location includes a read miss wherein, when the non-cacheable region is functioning correctly and the memory size of the non-cacheable region is correct, the second data pattern stored in the cache memory is flushed into the cacheable region of the second addressable location and is then read back through the cache memory tagged at the third addressable location.

21. A method for testing the functioning of a non-cacheable region within a direct mapped cache memory having a cache controller programmed with a non-cacheable region and a write-back write policy in a computer system having a main memory and a processing unit, the main memory and the processing unit coupled to the cache memory, the method comprising the steps of:

programming the main memory to include an image memory region corresponding to a physical memory region;

programming the cache controller wherein the non-cacheable region is tagged at the image memory region of the main memory;

reading first original data values from a first addressable location of a cacheable region in the physical memory region;

writing a first data pattern to the cache memory tagged at the first addressable location, wherein a write hit at the first addressable location causes the first data pattern to be written to the cache memory and not to the main memory;

reading second original data values from a second addressable location in the image memory region, the second addressable location corresponding to the first addressable location in the physical memory region and wherein the second addressable location is contained within both the non-cacheable region and a cacheable region; and wherein the second original data values are read directly from the main memory to the processing unit for the non-cacheable region of the second addressable location and wherein a read miss causes the first data pattern to be read from the main memory through the cache memory for the cacheable region of the second addressable location;

writing a second data pattern to the cache memory tagged at the second addressable location, wherein a write hit in the cacheable region of the second addressable location causes the second data pattern to be written to the cache memory and not to the main memory for the cacheable region of the second addressable location and wherein the second data pattern is written directly to the corresponding physical memory region of the main memory for the non-cacheable region of the second addressable location;

reading data stored and tagged at the first addressable location and corresponding to the non-cacheable region of the second addressable location to determine whether the first data pattern remains in the cache memory tagged at the first addressable location thereby indicating that the non-cacheable region is functioning correctly; and reading data stored and tagged at a third addressable location of a cacheable region in the physical memory region, wherein the third addressable location corresponds to the cacheable region of the second addressable location wherein a read miss causes the cache memory to flush the second data pattern into the cacheable region of the second addressable location and is then read back through the cache memory tagged at the third addressable location, when the non-cacheable region is functioning correctly and the memory size of the non-cacheable region is correct.

22. A program product stored on a computer readable medium, executable by a processor for testing the functioning of a non-cacheable region within a direct mapped cache memory having a cache controller programmed with a non-cacheable region and a write-back write policy in a computer system having a main memory, the main memory and the processor coupled to the cache memory, comprising:

means for programming the main memory to include an image memory region corresponding to a physical memory region;

means for programming the cache controller wherein the non-cacheable region is tagged at the image memory region of the main memory;

means for writing a first data pattern to the cache memory tagged at a first addressable location of a cacheable region in the physical memory region;

means for writing a second data pattern to the cache memory tagged at a second addressable location in the image memory region, the second addressable location corresponding to the first addressable location in the physical memory region and wherein the second addressable location is contained within both the non-cacheable region and a cacheable region;

means for reading data stored and tagged at the first addressable location and corresponding to the non-cacheable region of the second addressable location to determine whether the first data pattern remains in the cache memory tagged at the first addressable location thereby indicating that the non-cacheable region is functioning correctly; and means for reading data stored and tagged at a third addressable location of a cacheable region in the physical memory region, wherein the third addressable location corresponds to the cacheable region of the second addressable location, to determine whether the second data pattern is in the cache memory tagged at the third addressable location thereby indicating that the non-cacheable region is functioning correctly and that the memory size of the non-cacheable region is correct.

23. A program product, as recited in claim 22, further comprising:

means for reading first original data values from the first addressable location prior writing the first data pattern.

24. A program product, as recited in claim 23, wherein the means for writing the first data pattern includes a write hit at the first addressable location, wherein the first data pattern is written to the cache memory and not to the main memory.

25. A program product, as recited in claim 22, further comprising:

means for reading second original data values from the second addressable location prior to writing the second data pattern wherein the second original data values are read directly from the main memory to the processing unit for the non-cacheable region of the second addressable location and wherein the cacheable region of the second addressable location is a read miss and the first data pattern is read from the main memory through the cache memory for the cacheable region of the second addressable location.

26. A program product, as recited in claim 25, wherein the means for writing the second data pattern includes a write hit in the cacheable region of the second addressable location, wherein the second data pattern is written to the cache memory and not to the main memory for the cacheable region of the second addressable location and is written directly to the corresponding physical memory region of the main memory for the non-cacheable region of the second addressable location.

27. A program product, as recited in claim 22, wherein the means for reading the data stored and tagged at the third addressable location includes a read miss wherein, when the non-cacheable region is functioning correctly and the memory size of the non-cacheable region is correct, the second data pattern stored in the cache memory is flushed into the cacheable region of the second addressable location and is then read back through the cache memory tagged at the third addressable location.

28. A program product stored on a computer readable medium, executable by a processor for testing the functioning of a non-cacheable region within a direct mapped cache memory having a cache controller programmed with a non-cacheable region and a write-back write policy in a computer system having a main memory, the main memory and the processor coupled to the cache memory, comprising:

means for programming the main memory to include an image memory region corresponding to a physical memory region;

means for programming the cache controller wherein the non-cacheable region is tagged at the image memory region of the main memory;

means for writing a first data pattern to the cache memory tagged at a first addressable location of a cacheable region in the physical memory region;

means for writing a second data pattern to the cache memory tagged at a second addressable location in the image memory region, the second addressable location corresponding to the first addressable location in the physical memory region and wherein the second addressable location is contained within both the non-cacheable region and a cacheable region; and means for reading data stored and tagged at the first addressable location and corresponding to the non-cacheable region of the second addressable location to determine whether the first data pattern remains in the cache memory tagged at the first addressable location thereby indicating that the non-cacheable region is functioning correctly.

29. A program product, as recited in claim 28, further comprising:

means for reading first original data values from the first addressable location prior to writing the first data pattern.

30. A program product, as recited in claim 29, wherein the means for writing the first data pattern includes a write hit at the first addressable location, wherein the first data pattern is written to the cache memory and not to the main memory.

31. A program product, as recited in claim 28, further comprising:

means for reading second original data values from the second addressable location prior to writing the second data pattern wherein the second original data values are read directly from the main memory to the processing unit for the non-cacheable region of the second addressable location and wherein the cacheable region of the second addressable location is a read miss and the first data pattern is read from the main memory through the cache memory for the cacheable region of the second addressable location.

32. A program product, as recited in claim 31, wherein the means for writing the second data pattern includes a write hit in the cacheable region of the second addressable location, wherein the second data pattern is written to the cache memory and not to the main memory for the cacheable region of the second addressable location and is written directly to the corresponding physical memory region of the main memory for the non-cacheable region of the second addressable location.

33. A program product stored on a computer readable medium, executable by a processor for testing the functioning of a non-cacheable region within a direct mapped cache memory having a cache controller programmed with a non-cacheable region and a write-back write policy in a computer system having a main memory, the main memory and the processor coupled to the cache memory, comprising:

means for programming the main memory to include an image memory region corresponding to a physical memory region;

means for programming the cache controller wherein the non-cacheable region is tagged at the image memory region of the main memory;

means for writing a first data pattern to the cache memory tagged at a first addressable location of a cacheable region in the physical memory region;

means for writing a second data pattern to the cache memory tagged at a second addressable location in the image memory region, the second addressable location corresponding to the first addressable location in the physical memory region and wherein the second addressable location is contained within both the non-cacheable region and a cacheable region; and means for reading data stored and tagged at a third addressable location of a cacheable region in the physical memory region, wherein the third addressable location corresponds to the cacheable region of the second addressable location, to determine whether the second data pattern is in the cache memory tagged at the third addressable location thereby indicating that the non-cacheable region is functioning correctly and that the memory size of the non-cacheable region is correct.

34. A program product, as recited in claim 33, further comprising:

means for reading first original data values from the first addressable location prior to writing the first data pattern.

35. A program product, as recited in claim 34, wherein the means for writing the first data pattern includes a write hit at the first addressable location, wherein the first data pattern is written to the cache memory and not to the main memory.

36. A program product, as recited in claim 33, further comprising:

means for reading second original data values from the second addressable location prior to writing the second data pattern wherein the second original data values are read directly from the main memory to the processing unit for the non-cacheable region of the second addressable location and wherein the cacheable region of the second addressable location is a read miss and the first data pattern is read from the main memory through the cache memory for the cacheable region of the second addressable location.

37. A program product, as recited in claim 36, wherein the means for writing the second data pattern includes a write hit in the cacheable region of the second addressable location, wherein the second data pattern is written to the cache memory and not to the main memory for the cacheable region of the second addressable location and is written directly to the corresponding physical memory region of the main memory for the non-cacheable region of the second addressable location.

* * * * *